United States Patent
Loulavi et al.

(10) Patent No.: US 11,919,148 B2
(45) Date of Patent: Mar. 5, 2024

(54) CONFIGURABLE OBJECT INSERTION HANDLER FOR AUTOMATED ASSEMBLY

(71) Applicant: Bright Machines, Inc., San Francisco, CA (US)

(72) Inventors: Ran Loulavi, Tel Aviv (IL); Konstantin Fedchenko, Ashdod (IL); Jeremy Avizrat, Ashdod (IL); Adi Zavadski, Hadera (IL)

(73) Assignee: Bright Machines, Inc., San Francisco, CA (US)

( * ) Notice: Subject to any disclaimer, the term of this patent is extended or adjusted under 35 U.S.C. 154(b) by 553 days.

(21) Appl. No.: 16/949,755

(22) Filed: Nov. 12, 2020

(65) Prior Publication Data

US 2021/0138663 A1    May 13, 2021

Related U.S. Application Data

(60) Provisional application No. 62/934,385, filed on Nov. 12, 2019.

(51) Int. Cl.
*B25J 15/02* (2006.01)
*B25J 9/16* (2006.01)
*B25J 15/00* (2006.01)

(52) U.S. Cl.
CPC ......... *B25J 15/0253* (2013.01); *B25J 9/1633* (2013.01); *B25J 15/0019* (2013.01); *B25J 15/0066* (2013.01)

(58) Field of Classification Search
CPC  B25J 15/0253; B25J 15/0019; B25J 15/0066; B25J 9/1633; H05K 13/0404; H05K 13/0408
See application file for complete search history.

(56) References Cited

U.S. PATENT DOCUMENTS

| | | | | |
|---|---|---|---|---|
| 5,092,731 | A * | 3/1992 | Jones | B65F 3/08 294/205 |
| 5,769,592 | A * | 6/1998 | Christenson | B65F 3/046 294/902 |
| 8,733,810 | B2 * | 5/2014 | Oda | B25J 15/0004 414/730 |
| 2003/0131459 | A1 | 7/2003 | Morita | |
| 2018/0255670 | A1 * | 9/2018 | Watanabe | H05K 13/0408 |
| 2019/0143507 | A1 * | 5/2019 | Nishina | B25J 9/1669 700/245 |
| 2020/0189896 | A1 | 6/2020 | Raith et al. | |

FOREIGN PATENT DOCUMENTS

| | | |
|---|---|---|
| DE | 102017209838 A1 | 12/2018 |
| EP | 0282140 A2 | 9/1988 |

OTHER PUBLICATIONS

International Search Report and Written Opinion, PCT App. No. PCT/US2020/070780, Feb. 23, 2021, 13 pages.

* cited by examiner

*Primary Examiner* — Stephen A Vu
(74) *Attorney, Agent, or Firm* — Nicholson De Vos Webster & Elliott LLP; Judith Szepesi

(57) ABSTRACT

An object attachment handler comprising a configurable gripper, configured to define an open and closed position, based on a software definition of an object to be attached, and a fastening tool, automatically configured to apply a defined force curve at defined positions, to complete attachment of the object, based on the software definition of the object.

20 Claims, 18 Drawing Sheets

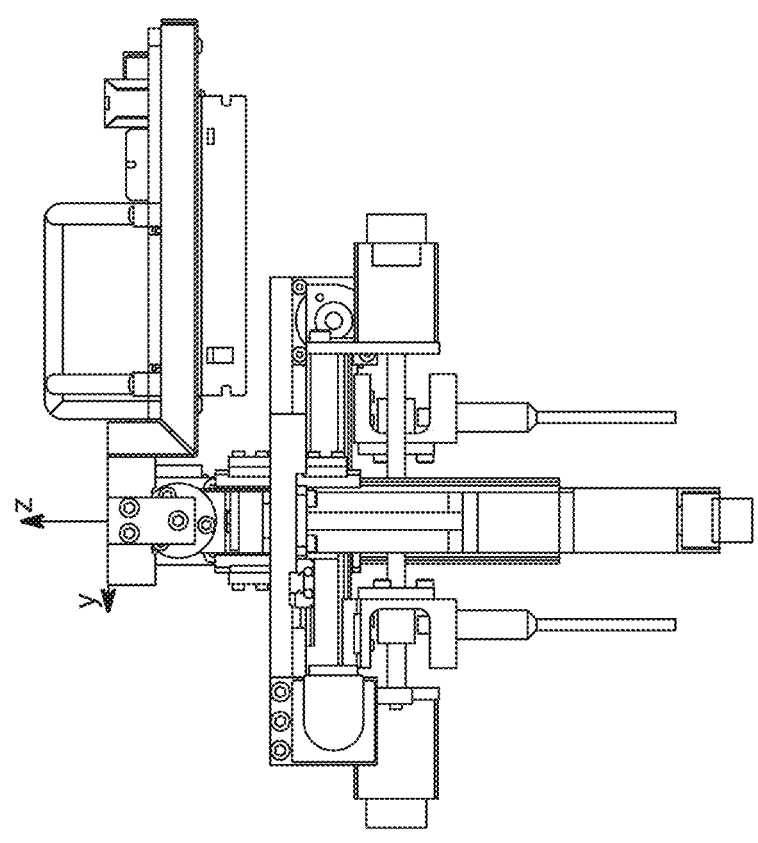
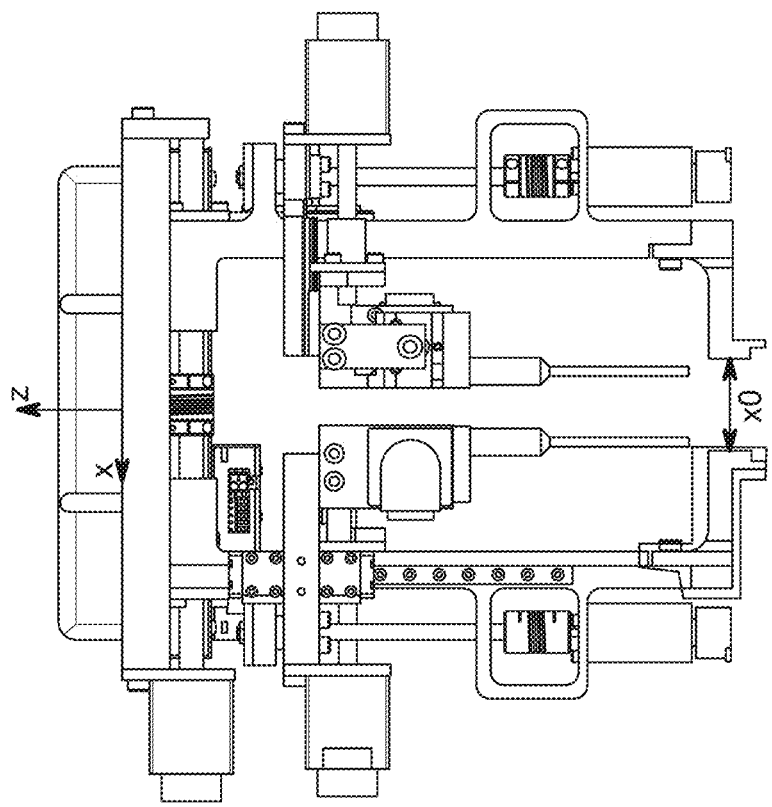
FIG. 3A

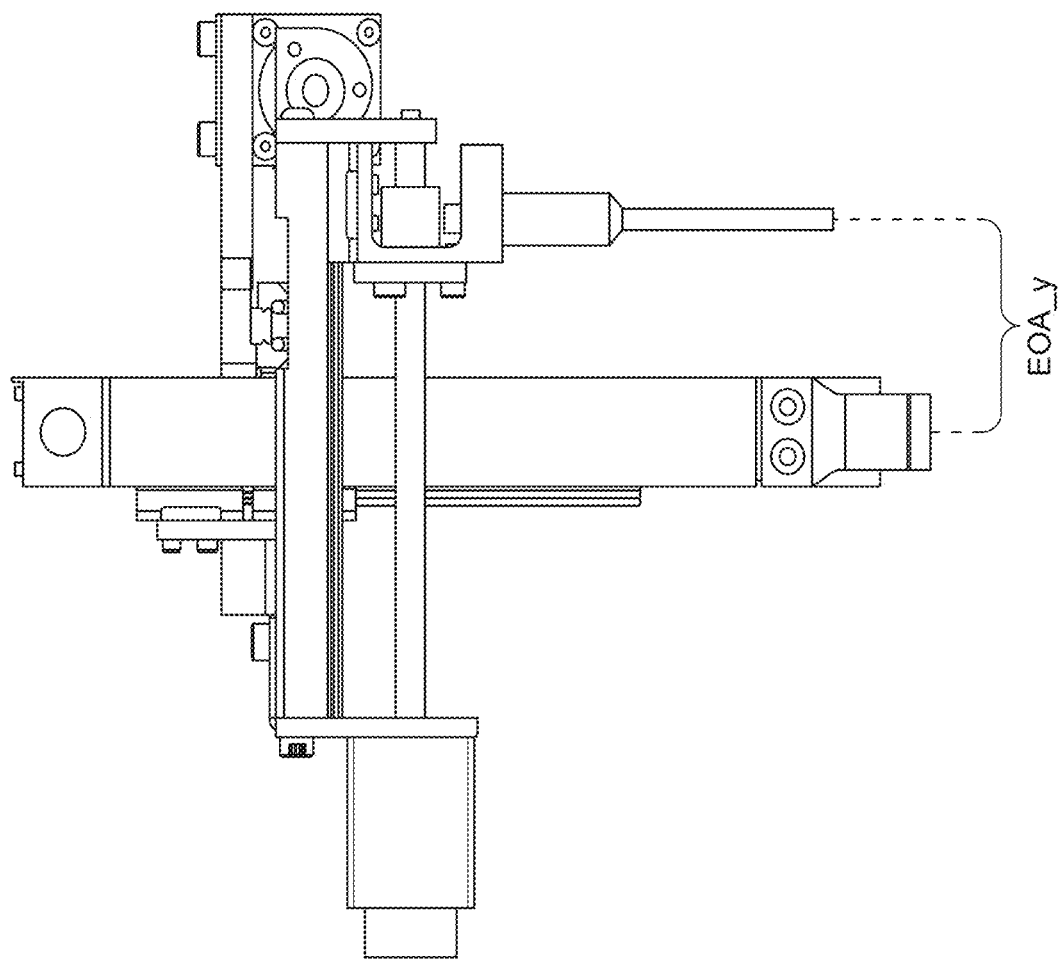
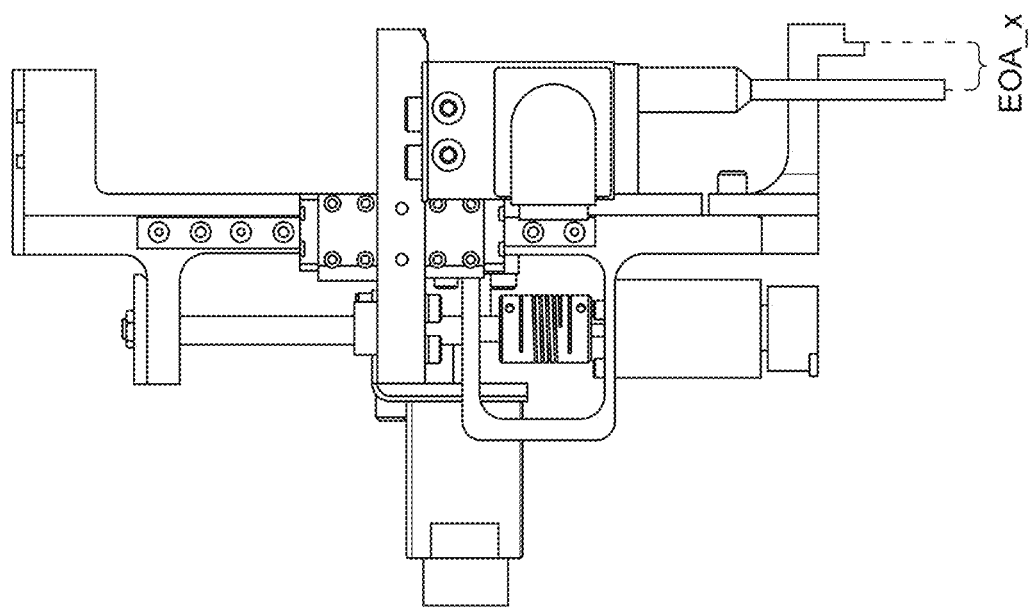
FIG. 3C

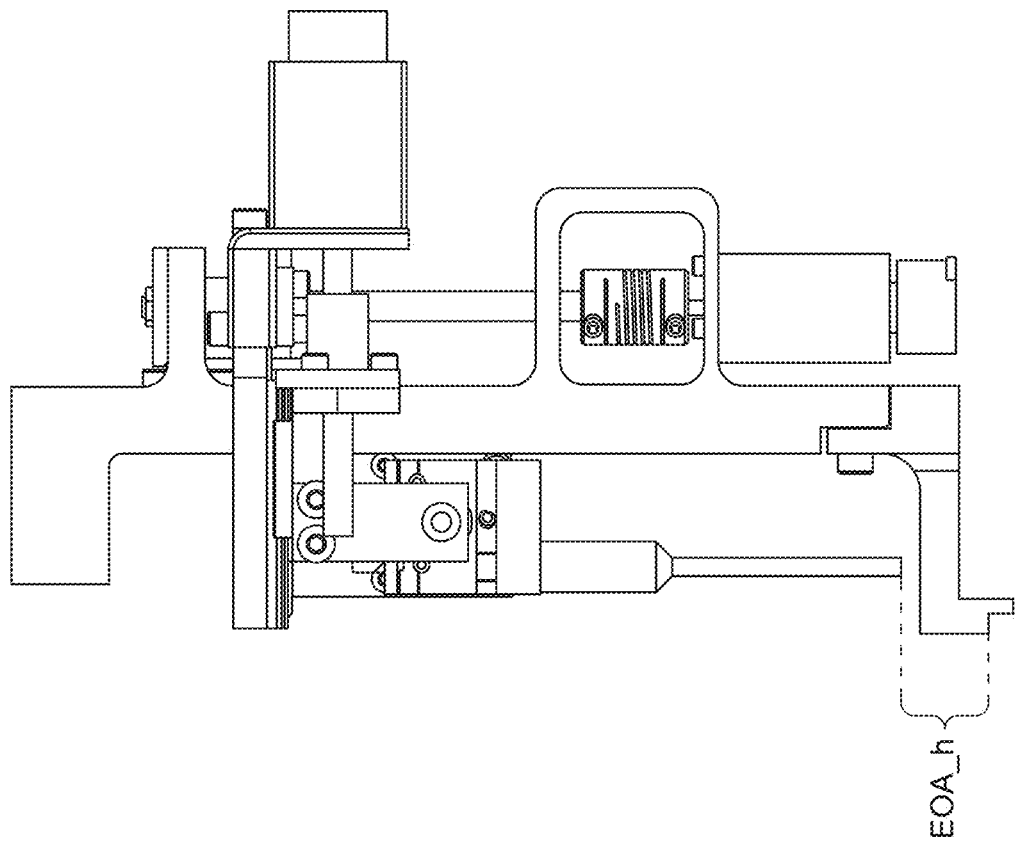
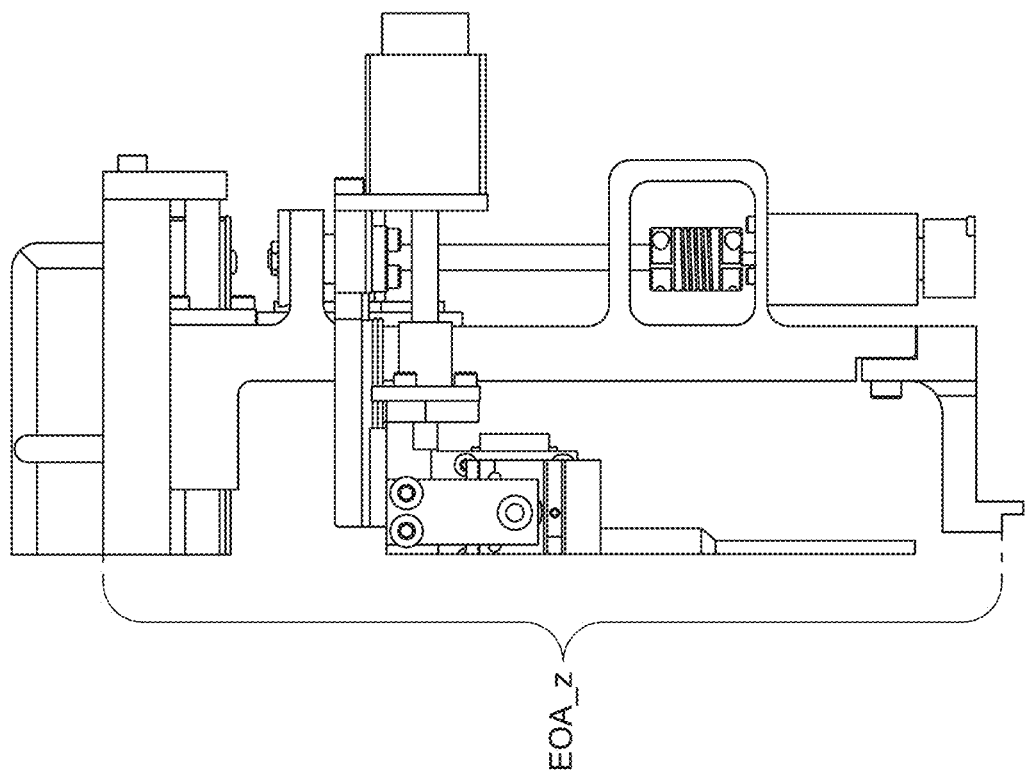
FIG. 3D

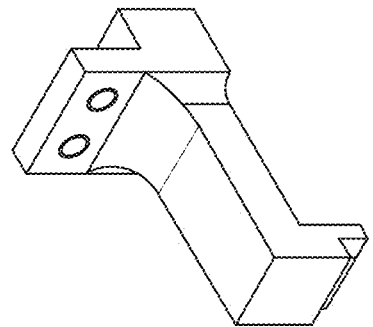
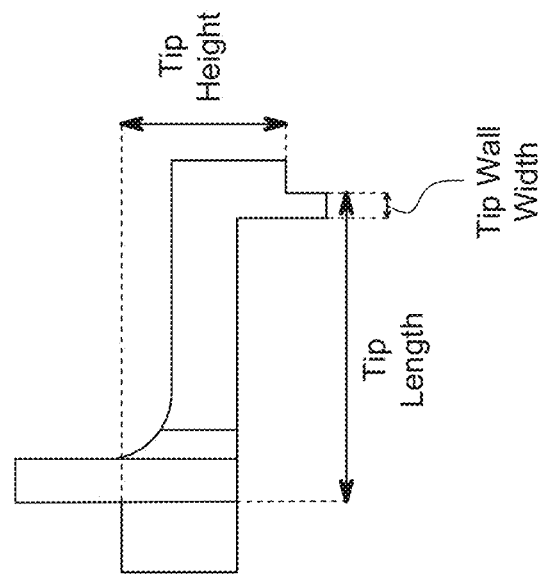
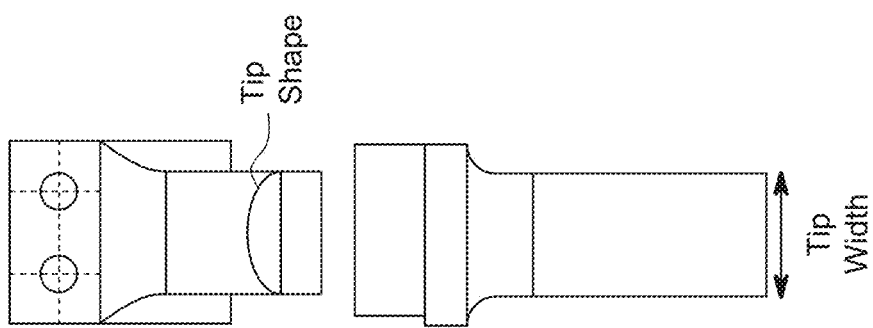
FIG. 4B

Fig. 8

Gripping Axis

| Operation name | Description |
|---|---|
| Pick-location | coordinates |
| Pick-open state | distance from homing location |
| Grip-close state | distance from homing location |
| Placing location | coordinates |
| Release | open state, distance from homing location |

Hammer axis

| Operation name | Description | Constraints in one embodiment |
|---|---|---|
| X | moving hammer in the X direction from the homming point. | max travel: 20mm |
| Y | moving hammer in the Y direction from the homming point | max travel: 84.5mm. Dead zone: 33-52.5 |
| Zst | the point which the force should start moving hammer in the Z direction from the homming point | max travel: 46.5mm |
| Zsp | the max position for getting the force drop moving hammer in the Z direction from the homming point | max travel: 46.5mm |

CONFIGURABLE OBJECT INSERTION HANDLER FOR AUTOMATED ASSEMBLY

RELATED APPLICATION

The present application claims priority to U.S. Provisional Application No. 62/934,385, filed on Nov. 12, 2019, and incorporates that application by reference in its entirety.

FIELD

The present invention relates to application handlers, and more particularly to an automatically configurable application handler for objects in automated manufacturing.

BACKGROUND

In general, the process of attaching an object such as a heat sink to a circuit board requires a customized design and implementation for the particular heat sink configuration. Heat sink configurations vary significantly in dimensions, attachment locations, and attachment types. Thus, designing and implementing an automated heat sink assembly station in an assembly line may take weeks while fully customized tooling is designed, fabricated and tested in an iterative process. Adapting the station to assemble a different type of heat sink (with different dimensions, attachment locations, or attachment types) again involves significant design and implementation of hardware and control software particular to the specific parameters of the heat sink, with implementation by an expert user. A similar situation occurs for a number of other object types beyond heat sinks, and for target mating locations beyond circuit boards.

BRIEF DESCRIPTION OF THE FIGURES

The present invention is illustrated by way of example, and not by way of limitation, in the figures of the accompanying drawings and in which like reference numerals refer to similar elements and in which:

FIGS. 3A-3D illustrate one embodiment of the dimensions which may be set, via software, for the object attachment handler.

FIG. 4B illustrates one embodiment of the gripper tip.

FIG. 8 illustrate one embodiment of the gripping axis and hammer axis descriptions that may be used for a heat sink applying object attachment handler.

DETAILED DESCRIPTION

Figure 1A:
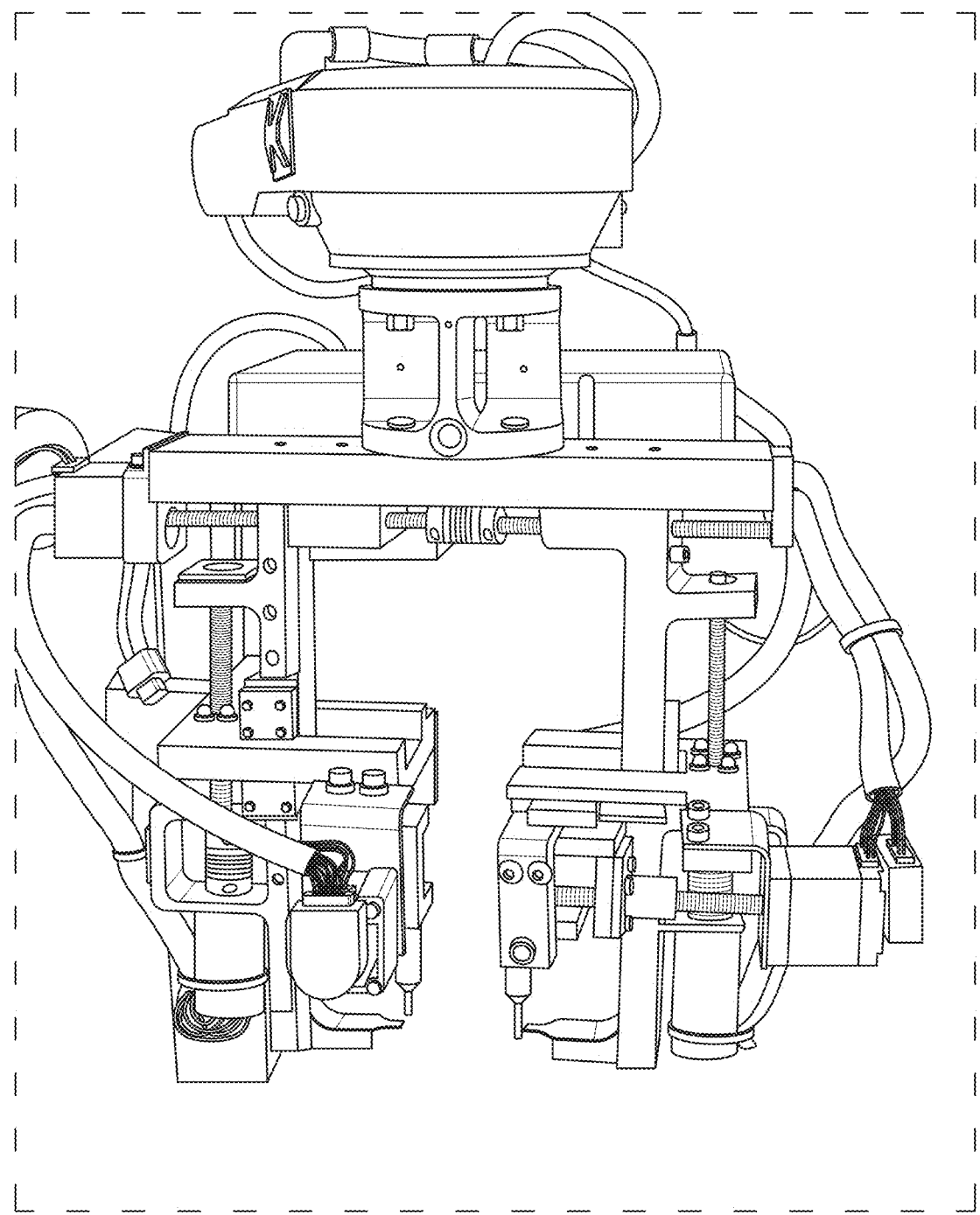
FIG. 1A is an exemplarily diagram of one embodiment of the object attachment handler.

A configurable object attachment handler is described, which may be configured through software. The handler in one embodiment is an end-of-arm tool for a robotic arm in a robotic cell for automated assembly. The handler in one embodiment enables the system to handle objects variable sizes and configurations for attachment to a socket, circuit board, or other workpiece. For example, the object for attachment may be a heat sink. After heat sink dimensions and attachment mechanism are defined in software, the system automatically reconfigures the gripper and the fastening tool to correctly grip, place, position, and attach the heat sink. Other types of objects can be similarly defined, so that the handler can be automatically configured for them, as will be described below.

In one embodiment, the user selects the heat sink or object specifics, including dimensions, attachment mechanism(s), and position of the attachment mechanism(s), for the heat sink. In another embodiment, the heat sink or object specifics may be read from a QR code or other indicator on the tray or on the heat sink, or other apparatus. Once that data is received, the system automatically configures the gripper, and the fastening tool. In one embodiment, configuring the fastening tool may include selecting and attaching a tip to the fastening tool. The tip may be a "hammer" to insert push pins, a hook to use spring clips, an appropriate screw driver (which encompasses nut drivers), to apply screws (standard or spring loaded) bolts, a melting tool for heat staking, etc. In one embodiment, there may be a rack for fastening tool tips which are automatically selected and attached to the gripper. In another embodiment, the changing of the fastening tool may be done manually.

Once the system is configured, it is able to rapidly attach heat sinks or other objects in an automated manufacturing environment. Because the heat sink/object definition is software based, when a different object is used, the design change requires only a few minutes of time, if it's a new configuration, or a few seconds of time if it's an object that has been previously defined and the fastening tool does not need to change. In one embodiment, the user may scan an object, or enter a part number, for automatic configuration. Additionally, this enables the system to handle a variety of types of object, with different types of attachment mechanisms. This enables a rapid adjustment, and improved speed of configuration for the robotic assembly system.

Although the specific examples given in the below description are for a heat sink including push pins, one of skill in the art should understand that the actual object attachment handler may be used for attaching/assembling other types of objects, and other types of attachment mechanisms. For example, heat sinks with press fit, push pin, rivet, snap on, through hole attachments may use a hammer or similar mechanism. Heat sinks with adhesive or solder-based attachment may use an adhesive dispenser. Heat sinks with bolt, screw, spring screw, based attachment may use a turning mechanism. Heat sinks with heat stake attachment, may use a melting tool. Once the dimensions of the object, and the positions and types of the attachment mechanism are defined, the system can position the object and apply the correct method for attachment automatically.

Additionally, the system may be used for attaching objects other than heat sinks. For example, the system may be used to attach fans, heat pipes, DIMM modules, printed circuit boards into cases, or other elements which may vary in size or configuration, and for which such a configurable attachment handler is useful.

The following detailed description of embodiments of the invention makes reference to the accompanying drawings in which like references indicate similar elements, showing by way of illustration specific embodiments of practicing the invention. Description of these embodiments is in sufficient detail to enable those skilled in the art to practice the invention. One skilled in the art understands that other embodiments may be utilized, and that logical, mechanical, electrical, functional and other changes may be made without departing from the scope of the present invention. The following detailed description is, therefore, not to be taken in a limiting sense, and the scope of the present invention is defined only by the appended claims.

Figure 1B:
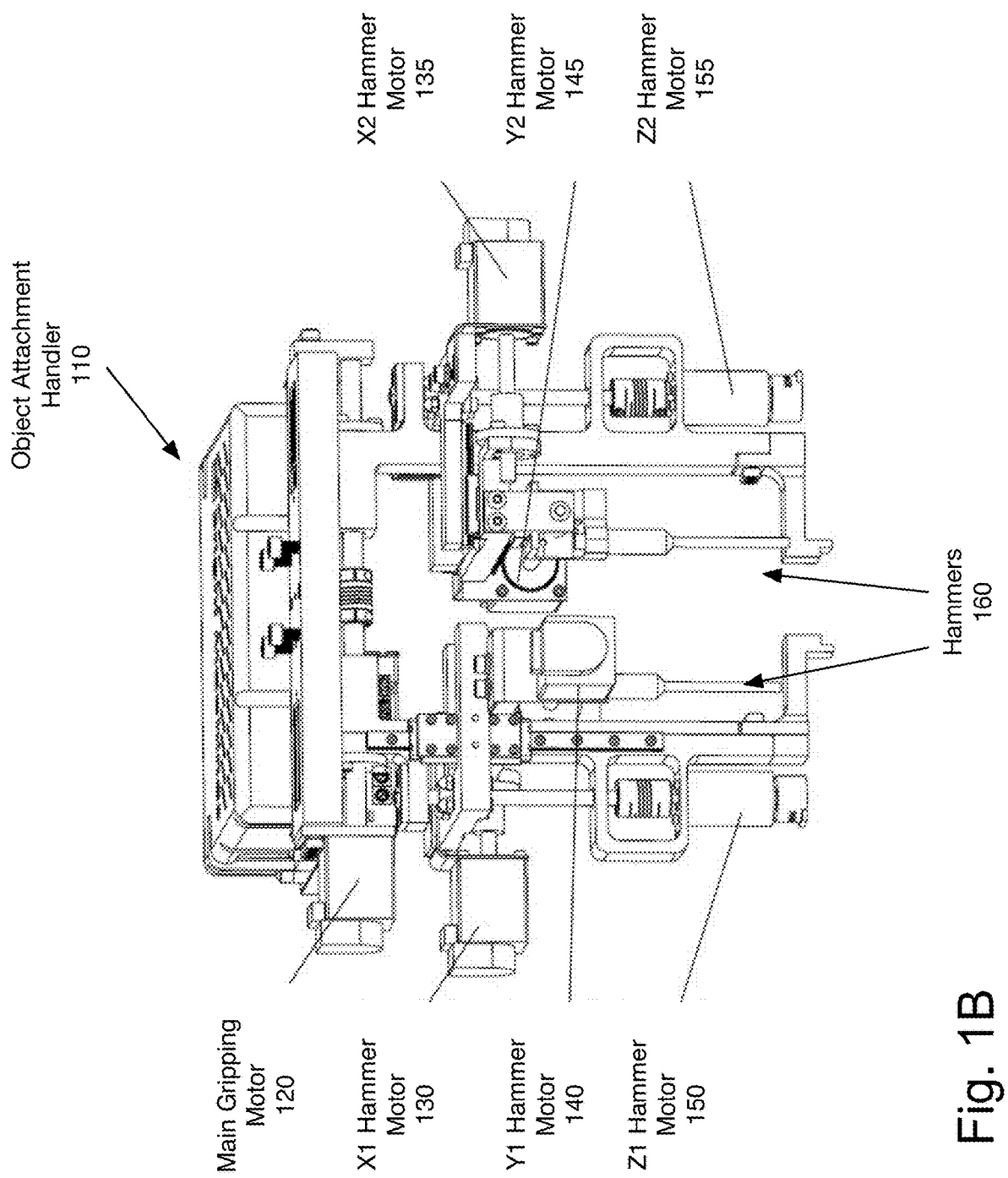
FIG. 1B is diagram of one embodiment of the object attachment handler.

FIG. 1A is a photograph of one embodiment of the object attachment handler. FIG. 1B is diagram of one embodiment of the object attachment handler. In one embodiment, the object attachment handler includes seven motors. A motor that opens and closes the grippers, the main gripper motor 120. The gripper has a defined open and closed position based on the configuration of the object to be placed. In one embodiment, the location of each jaw of the configurable gripper is individually configurable, providing a true symmetric grip or calibrated pick point.

In one embodiment, there are two hammers 160 as fastening tools. Each hammer 160 has three degrees of freedom, in one embodiment. The position of the hammer 160 in the X-Y plane is determined based on the position of the attachment elements of the object, e.g. pegs for a heat sink. The hammer 160 is lowered, with hammer force, to push in pegs, in one embodiment. In one embodiment, when the object is defined, the hammers 160 are moved in the X-Y plane using the X and Y dimension hammers 130, 135, 140, 145, to the appropriate locations for the attachment. In one embodiment, during the insertion process the hammers 160 only change their position in the vertical direction, under the control of the Z1/Z2 motors 150/155. In another embodiment, the hammers 160 may be in a neutral position during the initial insertion, and may move in both horizontally and vertically for insertion.

Although the above example shows a hammer, a similar set of motors may be present for other types of fastening tools. For example, for a screw driver, in addition to the XY-positioning motors, and the vertical movement motor, the fastening system would include a turning motor, to rotate the screw driver once it is in the correct place. For an epoxy fastening tool, in addition to the XYZ-positioning motors, there may be a "dispensing" motor to dispense the epoxy in the correct location. For a melting tool, in addition to the XYZ positioning motor the defined variables in one embodiment may include a position for the melter at which heat is applied, and the temperature for the melting. For a spring clipping tool, in one embodiment the variables defined may include a first position when the spring clip is hooked, a second position where the spring clip is extended, and a third position, where the spring is released.

Other sets of motors and position definitions may be used, as appropriate for the particular application mechanism. In one embodiment, there may be two sets of attachment mechanisms which move independently, such as a positioner which ensures that the object stays in place, and an attacher which applies the attachment mechanism while the positioner keeps the object in place.

Figure 2A:
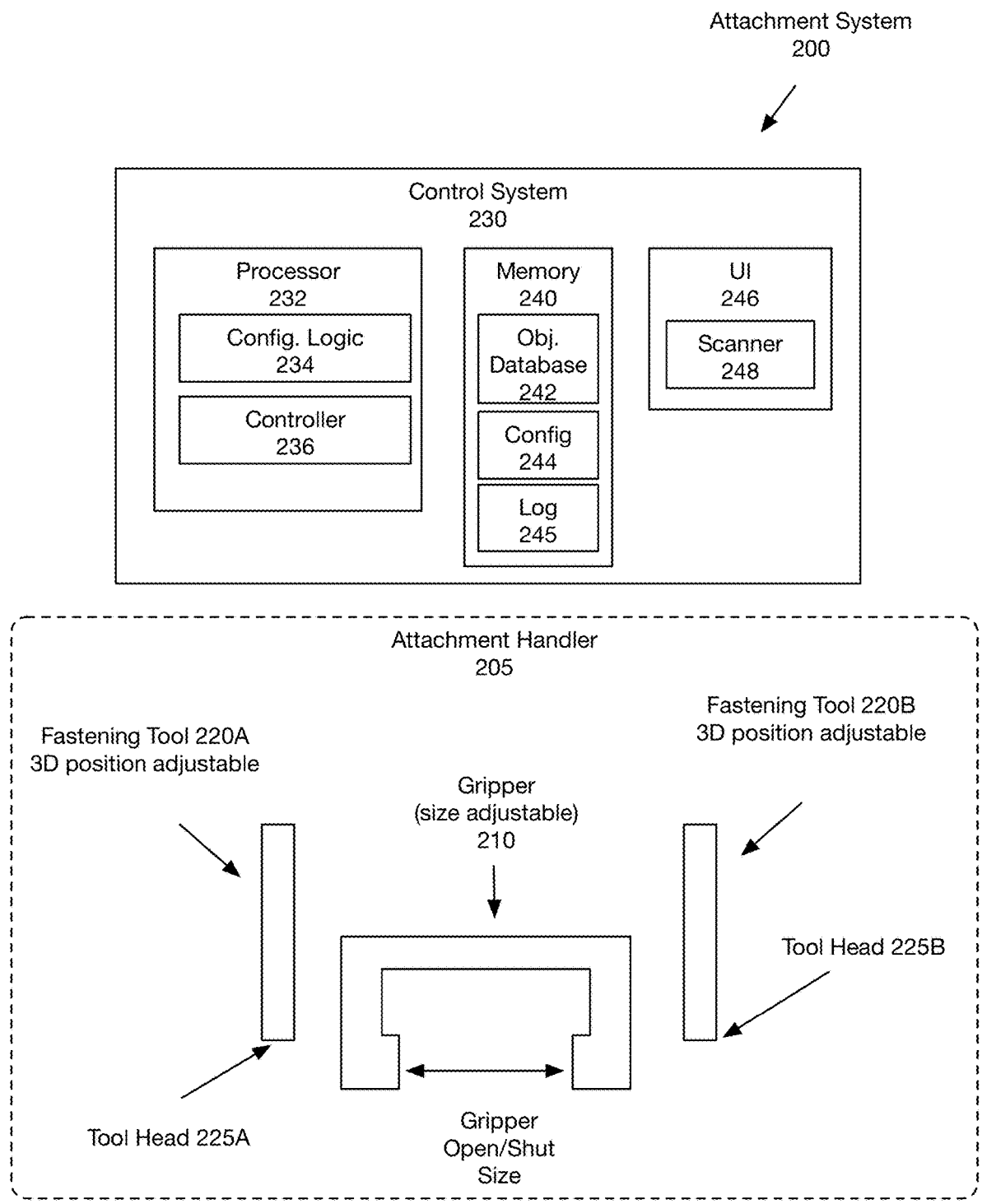
FIG. 2A is a block diagram illustrating one embodiment of the primary elements of the object attachment handler.

FIG. 2A is a block diagram illustrating one embodiment of the primary elements of the attachment system 200. The attachment handler 205 includes gripper 210, one or more fastening tools 220 having tool heads 225. As noted above, in one embodiment, there are two fastening tools 220A, 220B, corresponding to attachment mechanisms for both sides of the object, such as pegs for a heat sink. Of course, the system may include a single fastening tool 220, or more than two fastening tools 220 as well. For example, a configuration may include four fastening tools.

The attachment handler 205 is configured and controlled by control system 230. The control system in one embodiment is a computer system, which may include a processor 232, memory 240, and other elements. The processor 232 may be microprocessor or a simple control unit. In one embodiment, rather than a local computer, control system 230 may be a remote device, or a cloud-based system. Although the control system 230 is illustrated as a unitary element, the various portions of the control system 230 may be on different devices, which may not be collocated, in some embodiments.

A configuration logic 234 configures the attachment handler 205. The configuration includes the positioning of fastening tools 220, and the size of the gripper 210, in the open and closed position. Additionally, the configuration logic 234 may define the position of the tray from where an object is picked up, and the position of the element to which the object is attached. In one embodiment, the controller 236 controls the movements of the attachment handler 205. In one embodiment, the controller 236 may be physically part of the attachment handler system In one embodiment, the configuration is based on the characteristics of the object being attached. Those characteristics include size, shape, attachment mechanism, and attachment mechanism position of the object. In one embodiment, the user may enter this data via user interface 246. In one embodiment, the user or system may use scanner 248 to scan an identifier such as a QR or UPC code, and automatically identify the object for attachment, and its characteristics. In one embodiment, the system may have a database 242 of such devices, such that once characteristics are entered or obtained another way, the system may fetch that data from database 242. In one embodiment, configuration memory 244 stores the other configuration data for the attachment handler and its motions. In one embodiment, log 245 stores the data from the attachment processes executed. User interface 246 provides alerts, in one embodiment, when a failure is detected. Other conventional elements which may be present in the system, e.g. the robot arm, the camera providing fiducial-based alignment, motors, etc. are not shown for simplicity.

Figure 2B:
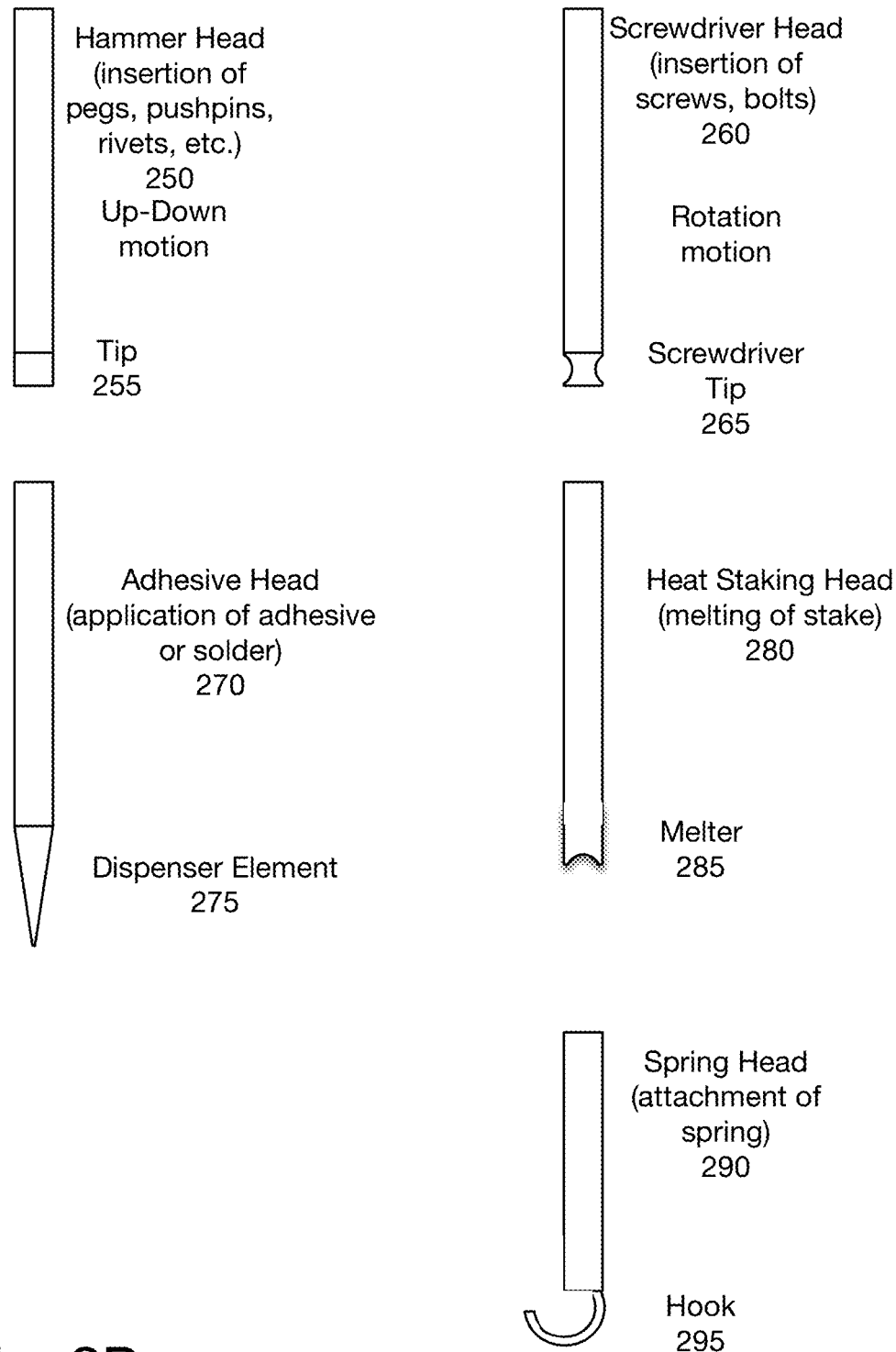
FIG. 2B is a diagram illustrating exemplary embodiments of the fastening tools, for various types of attachments.
Figure 3B:
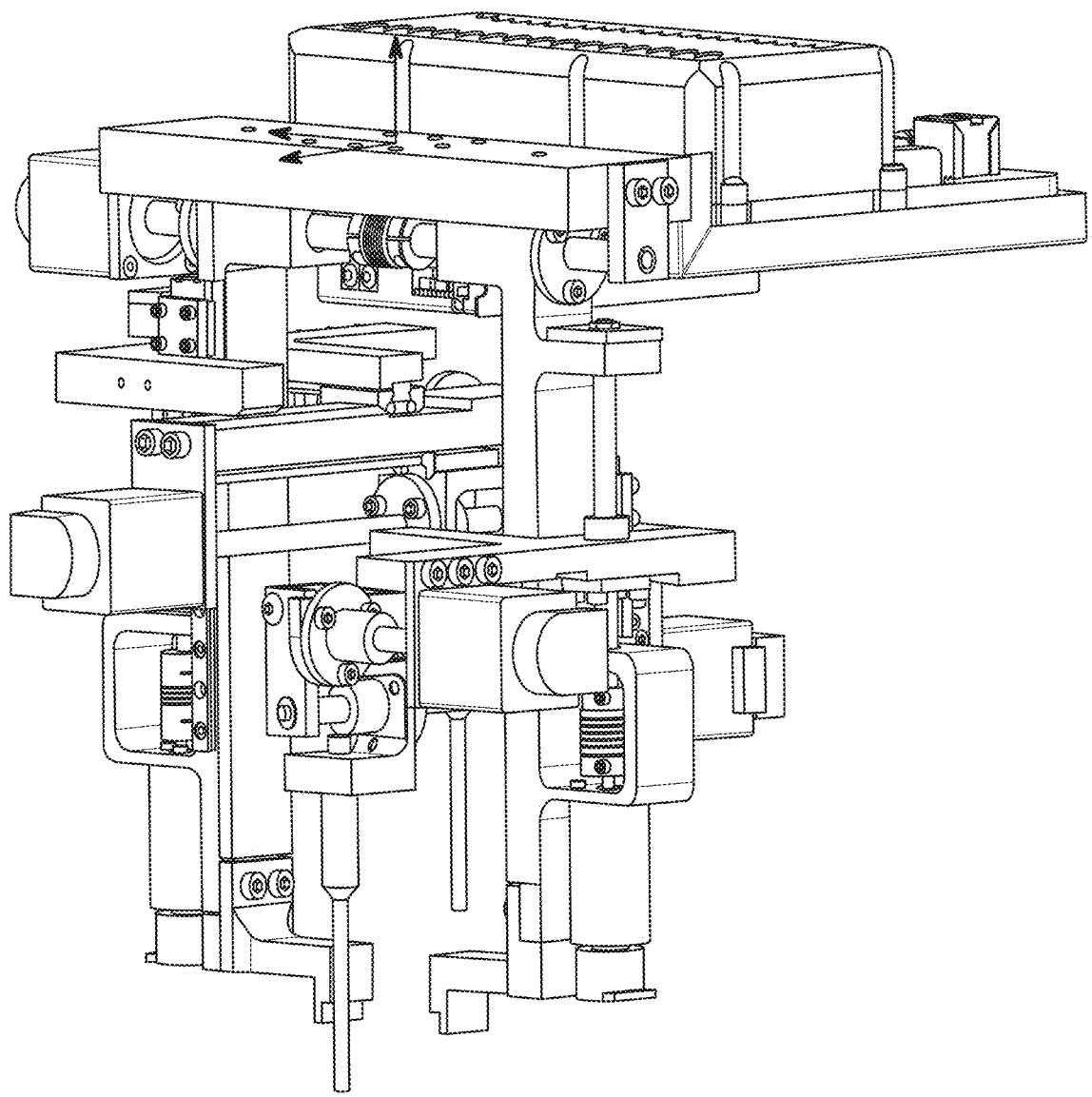

FIG. 2B illustrates some exemplary fastening tools. The fastening tools may include a hammer 250, for the insertion of pegs, push pins, rivets, etc. In one embodiment, fastening tool tip 255 may be customized for the kind of attachment mechanism being used. For example, for the insertion of a peg, a rubber tip that is shaped appropriately for the peg may be used. This is to ensure that the force is applied vertically and to reduce the risk of slippage. In one embodiment, the hammer head 250 has a vertical insertion motion. In one embodiment, the motion pattern for the vertical head includes initially applying force at a first level, and then applying stronger force, until the piece is completely seated, and the object is attached.

Screwdriver head 260 also moves vertically, but once seated provides a rotation motion, for the insertion of screws, bolts, and other such fasteners. Screwdriver tip 265 may be customized to the particular type of screw or bolt used. In one embodiment, a screw dispenser is associated with the screwdriver head 260, as is known in the art. Alternatively, the screw or bolt may be already positioned, and the screwdriver head lowers to insert the screwdriver tip 265 into the screw, and then spins, as is known in the art.

Adhesive head 270 is designed to apply an adhesive. In one embodiment, adhesive head 270 dispenses an adhesive such as epoxy or solder for attaching the object. In one embodiment, the adhesive head may travel, while dispensing the adhesive from dispenser element 275. In one embodiment, the adhesive head may dispense dots of adhesive. In one embodiment, an additional motor may control the dispensing.

Heat staking head 280 is designed to melt a post that is inserted through the heat sink or object, to complete the fastening. The heat staking head 280 may provide insertion force as well as melting. In one embodiment, the shape of the melter 285 may depend on the shape of the stake being used. For example, a hollow stake may have a different melter 285 to melt the stake and fasten the object, as is known in the art.

A spring head 290 is designed to attach a spring clip, in one embodiment. The spring head 290 has a hook, to capture the spring, extend it, and release it in the correct position. In one embodiment, the hook 295 portion may rotate to release the spring. In another embodiment, the spring head 295 may rotate to release the spring. If the hook 295 is rotated, it may be controlled by a separate motor.

Other types of fastening tools may be used in the system.

FIGS. 3A-3D illustrate one embodiment of the dimensions which may be set, via software, for the object attachment handler, the X, Y, and Z positions of the fastening tools, the displacement along the X, Y, and Z axes between the end of arm and the fastening tool (EOA_x/y/z), as well as the distance of travel for the fastening tools.

Figure 4A:
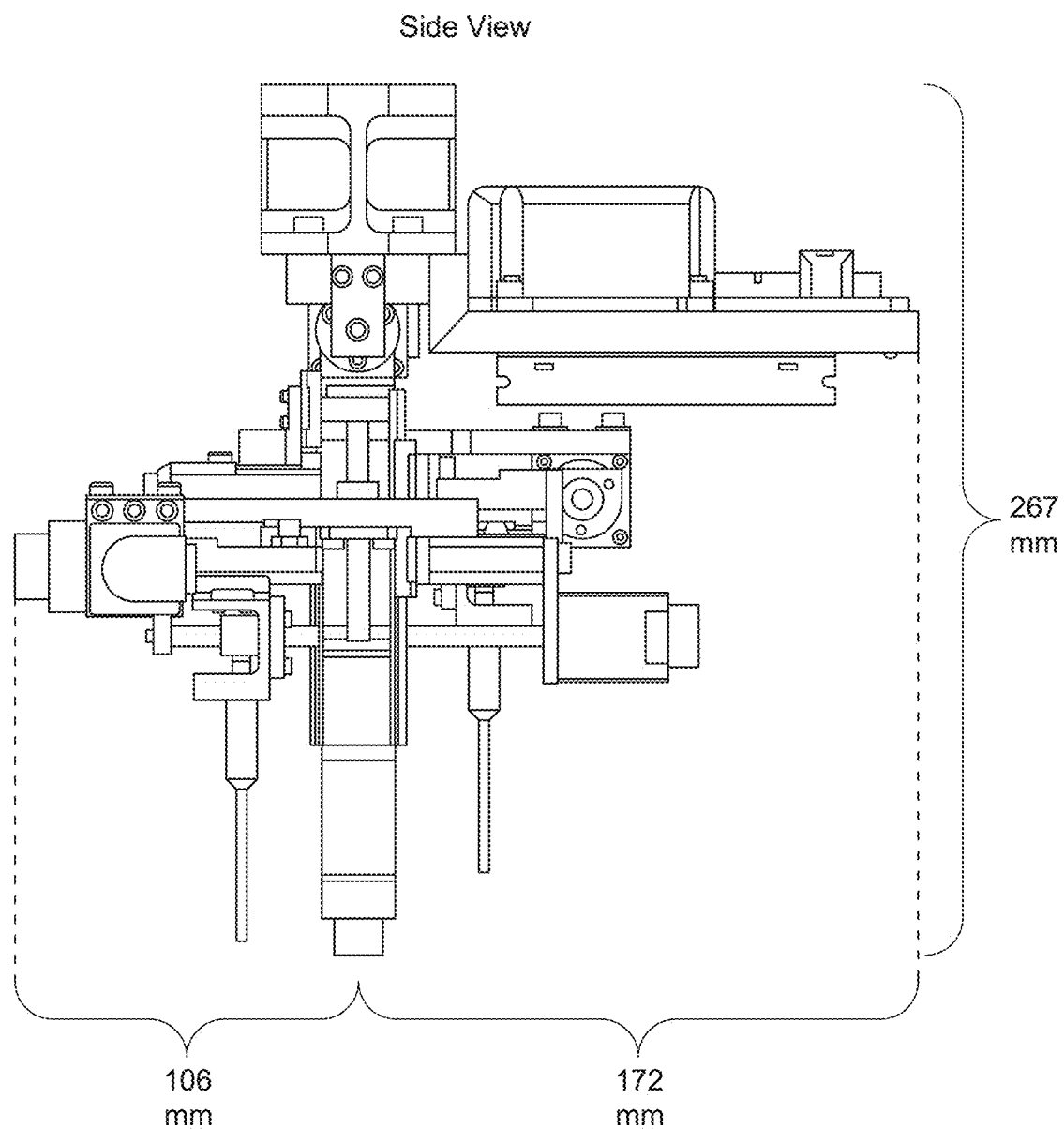
FIG. 4A illustrates one embodiment of the physical dimensions of the object attachment handler.
Figure 4A:
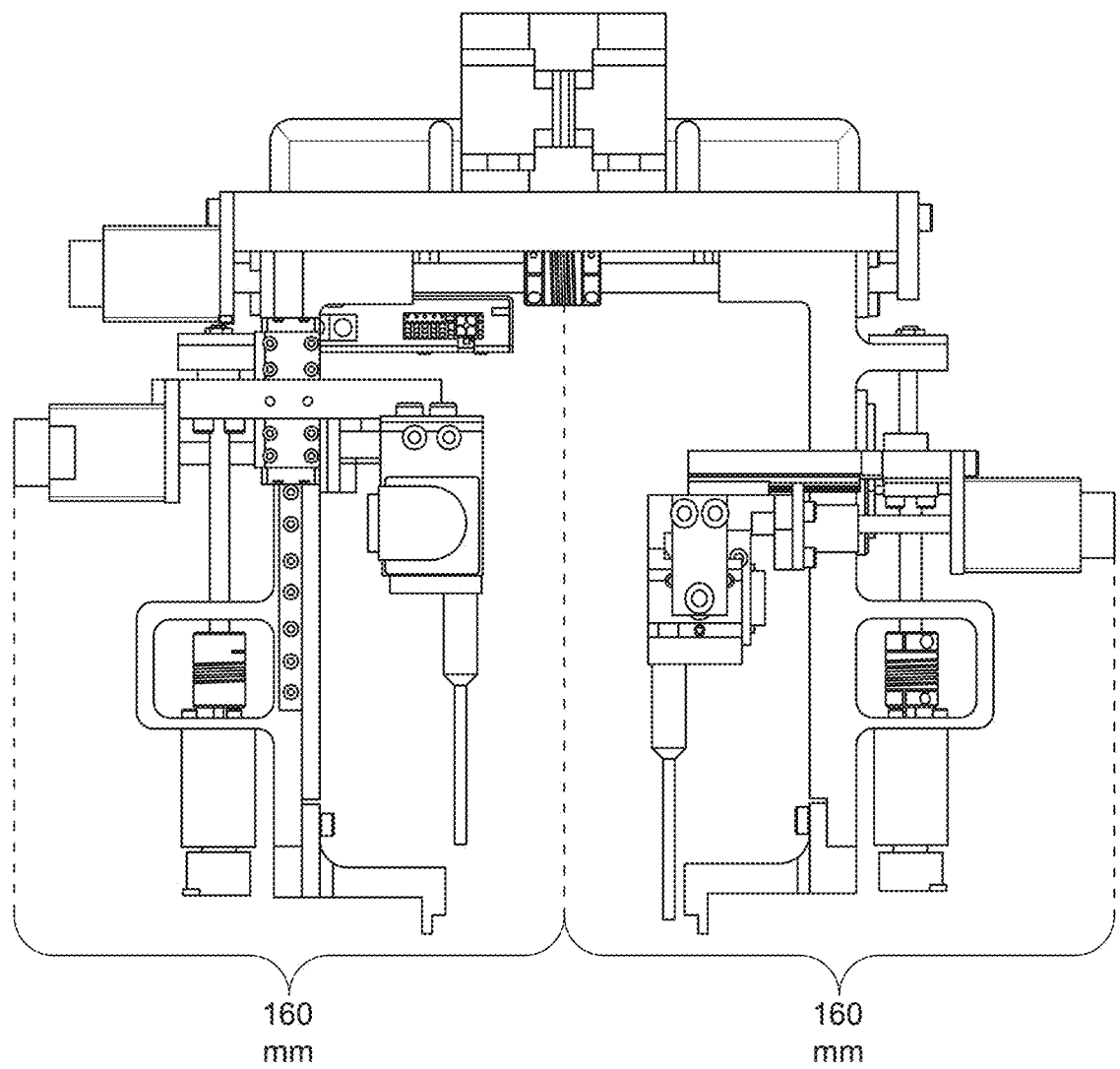
Figure 4A:
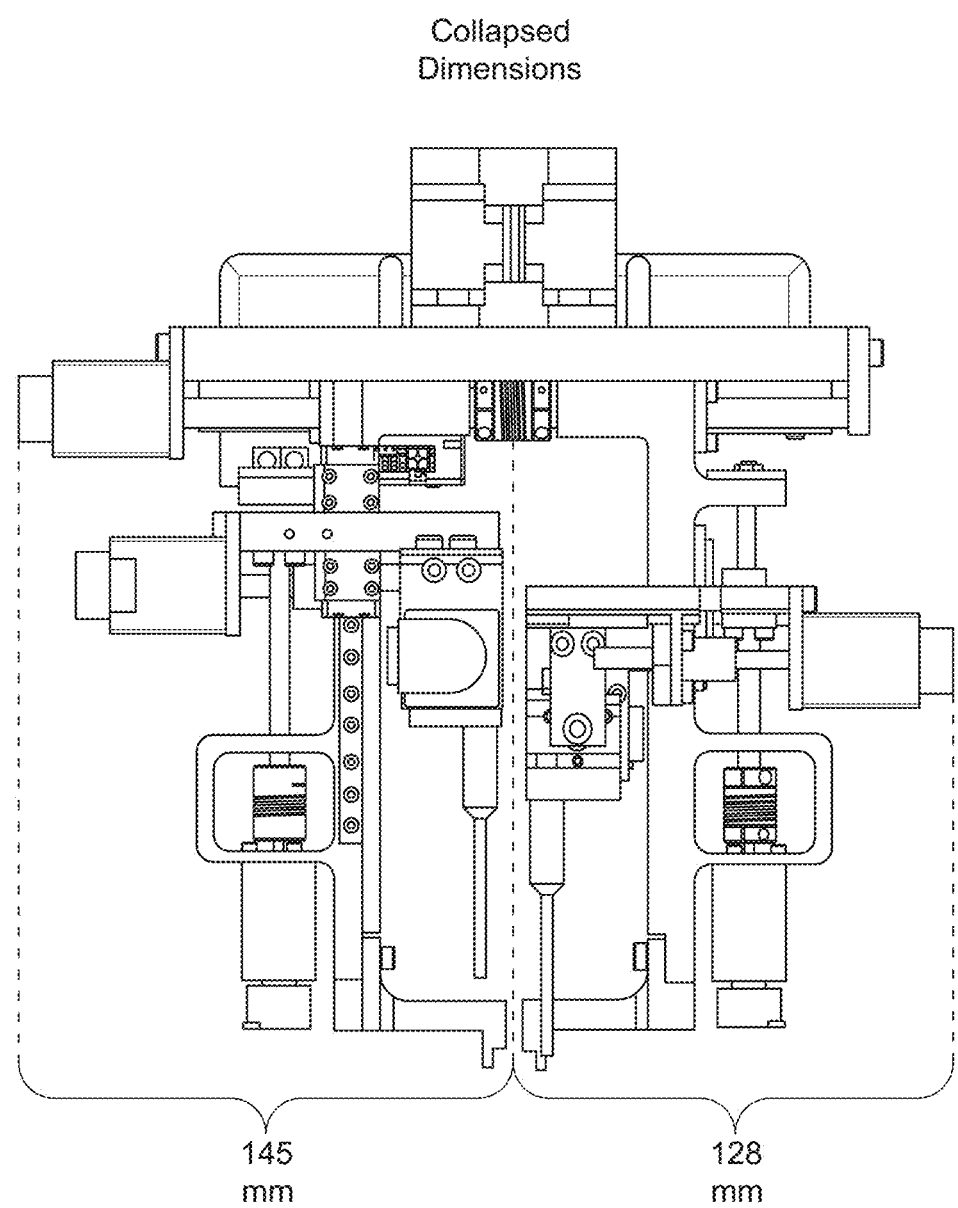

FIG. 4A illustrates one embodiment of the physical dimensions of the object attachment handler. FIG. 4B illustrates one embodiment of the gripper tip.

Figure 5:
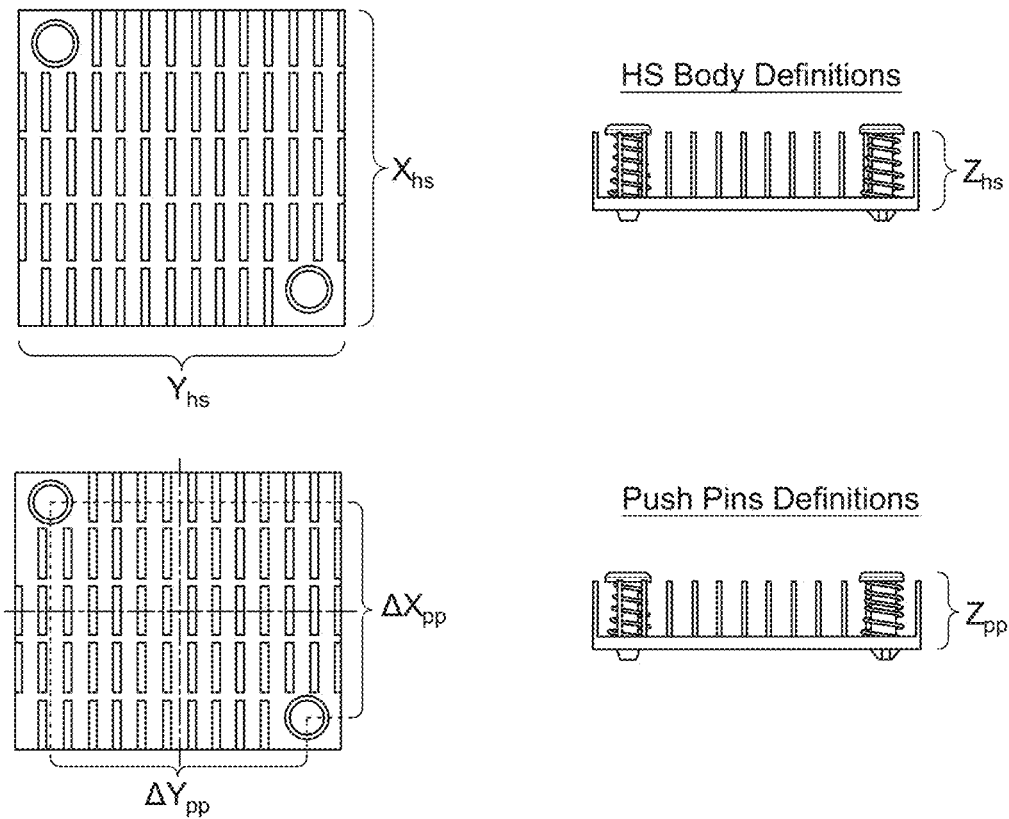
FIG. 5 is one embodiment of the user inputs for a heat sink, which may be attached by the object attachment handler onto a printed circuit board.

FIG. 5 is one embodiment of the user inputs for a heat sink, which may be one of the objects attached onto a printed circuit board. The heat sink characteristics in one embodiment include the X and Y dimensions as well as height Z. In one embodiment, the characteristics further include the positions of the fasteners. In one embodiment, as illustrated the position includes the distance between the fasteners in the X and Y direction, and the fastener height. In one embodiment, fastener definition includes the height prior to insertion, and the height post-insertion. In one embodiment, the heat sink characteristics also include the type of fastener (here push pins). Alternative ways of defining the position of the fasteners may be used.

Figure 6:
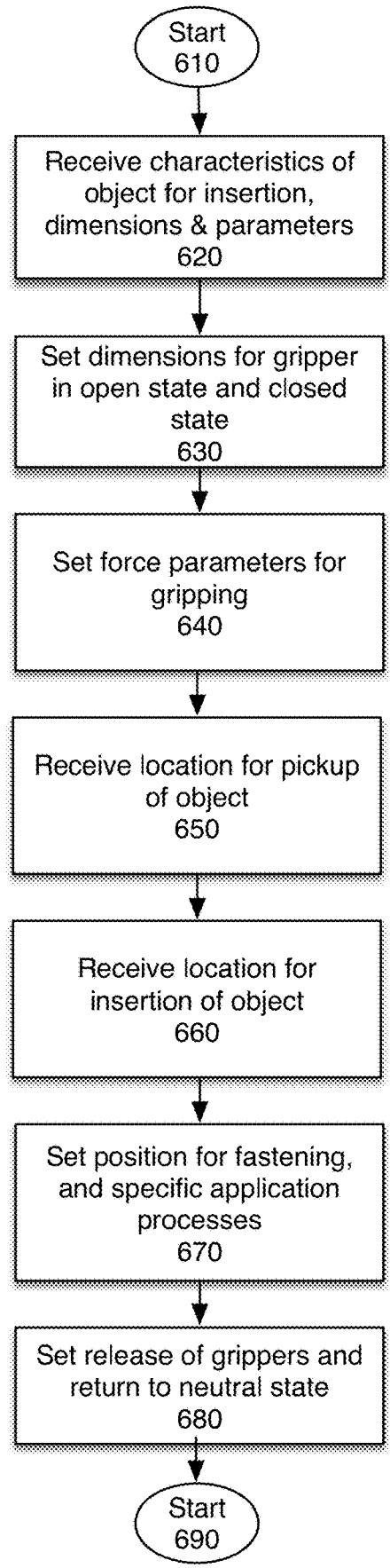
FIG. 6 is a flowchart of one embodiment of defining in software the parameters for the object attachment handler.

FIG. 6 is a flowchart of one embodiment of defining in software the parameters for the object attachment handler. The process starts at block 610. At block 620, the characteristics of the object for insertion are received. In one embodiment, this may be entered by a user. In one embodiment, this may be retrieved from a database or other source. The characteristics include in one embodiment the dimensions, attachment mechanism used, position of the attachment mechanisms. In one embodiment, the characteristics may also include the rigidity of the object, which defines the force with which the gripper holds the object, and the force that may be used for insertion to ensure no damage is done to the object or the attachment mechanism.

At block 630, the dimensions for the gripper are automatically set, in the open state and the closed state, based on the characteristics of the object to be inserted. Generally, the gripper is opened wide enough to fit around the top portion of the object, which may be wider than the area which is held by the gripper. The dimension for the closed gripper is also set. In one embodiment, the height at which the gripper closes is also automatically set, based on the object configuration.

At block 640, the force parameters for gripping are automatically set, based on the characteristics of the object. The force parameters define how strongly the gripper holds the object.

At block 650, the location for the pickup of the object is received. In one embodiment, the object is picked up from a tray or conveyor. In one embodiment, this data may be configuration data available to the system.

At block 660, the location for the insertion of the object is received. In one embodiment, the object is placed in the appropriate position in an assembly, such as a circuit board. The handling of the destination for the object is not addressed here, but in one embodiment, new boards or devices onto which the object is inserted, are received via a conveyor belt. In one embodiment, this data may be configuration data available to the system.

At block 670, the position for the fastening and application process is automatically set, based on the characteristics of the object. In one embodiment, the position for the fastening tool may include one or more locations where the fastening tool is used, and the specific use. For example, for a push pin, the position of the push pins, the height of the push pins prior to full insertion and after full insertion, and the amount of force used to insert them would be set. For a screw, the position of the screw, the height of the screw head prior to full insertion and after full insertion, and the force used for screwing it in would be set.

At block 680, the release of the grippers is automatically set. In one embodiment, the grippers return to a neutral position after insertion. The use of a neutral position makes it easier for the process to be perfectly repeated each time. The process then ends at block 690.

Figure 7:
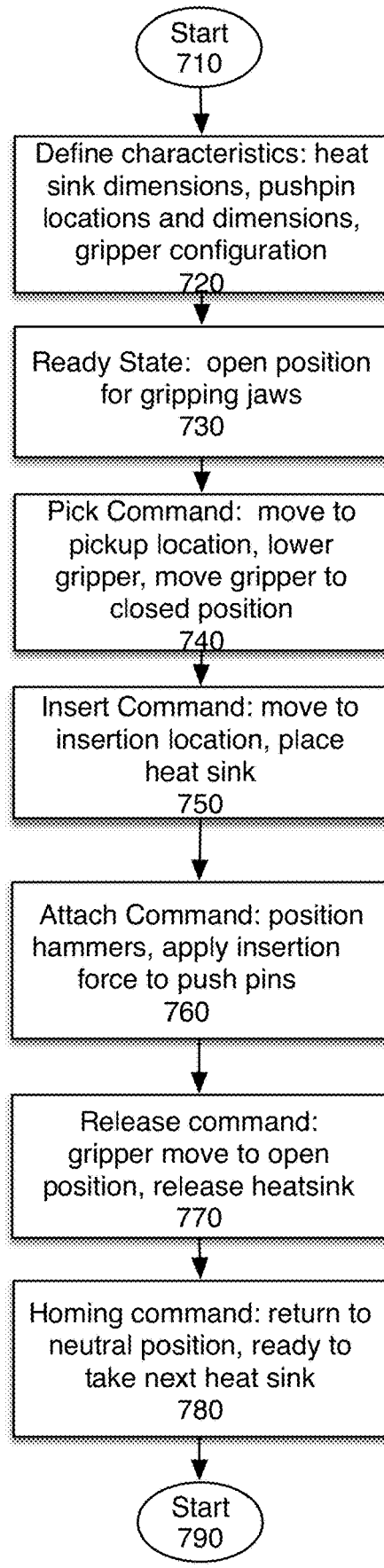
FIG. 7 is a flowchart of one embodiment of the commands for the object attachment handler, for a heat sink.

FIG. 7 is a flowchart of one embodiment of the commands for the object attachment handler, for a heat sink. At block 720, the characteristics of a heatsink, which is an object to be inserted, are defined. For this heatsink, the characteristics in one embodiment are the dimensions of the heatsink, and the locations of the push pins. FIG. 5 illustrates the heatsink characteristics that are defined.

Returning to FIG. 7, after the heat sink characteristics are provided, the parameters for the object attachment handler are automatically set. The parameters include the base position of the fastening tools, and how fast and how low are moved to insert the push pins, the open and closed positions of the gripper, etc.

At block 730, the ready state command is sent, which sets the gripper to the open position. In one embodiment, the gripper starts in a neutral position, and returns to that neutral position between insertions.

At block 740, the pick command is sent. The gripper moves to the pickup location, lowers, and closes on the heatsink to be inserted, and lifts.

At block 750, the insert command is sent. The insert command moves the gripper to the insertion location and places the heatsink in the insertion position.

At block 760, the attach command is sent. The attachment command moves the hammers to the attachment position and applies the insertion force to the pushpins.

At block 770, the release command is sent. The release command opens the gripper and releases the heatsink.

At block 780, the homing command is sent. The homing command returns the gripper to the neutral position, ready to take the next heat sink. The process then ends, at block 790. Although this flowchart describes one embodiment of a process for inserting a heat sink onto a circuit board, one of skill in the art would understand that this process may be used to insert other types of objects onto circuit boards, or into other types of assemblies. Additionally, some steps, like homing may be skipped. Furthermore, these commands are merely exemplary. Actual commands may be more or less detailed.

FIG. 8 illustrates one embodiment of the gripping axis and hammer axis descriptions that may be used. The gripping axis defines the locations for the gripper. It includes, in one embodiment, a pick location, and pick-open state, which is the position at which the gripper is opened. The grip close state defines the position at which the gripper is closed. The placing location defines where the heat sink or other items is placed onto the workpiece. The release defines the distance from the homing location at which the object is released. The hammer axis defines the locations for the fastening. For the Z-dimension (e.g. vertical travel) the dimensions define the starting point, and the maximum travel.

Figure 9:
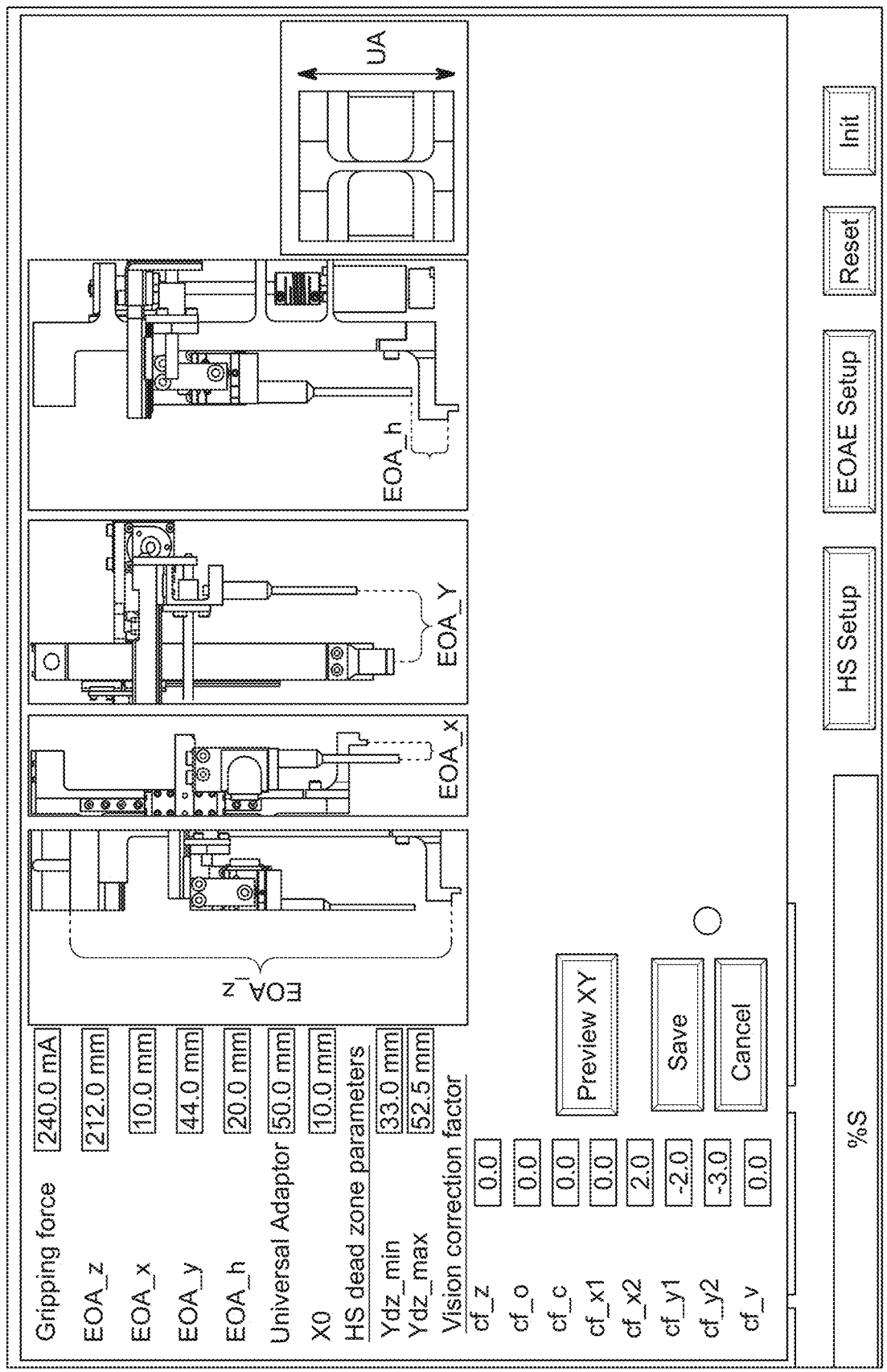
FIG. 9 shows one embodiment of the gripping force definition user interface, which may be used.

FIG. 9 illustrates one embodiment of the user interface to enter the gripping force, and position of the gripper. The gripping force defines the force with which the gripper is closed. This depends on the particular heat sink's material, in one embodiment.

Figure 10:
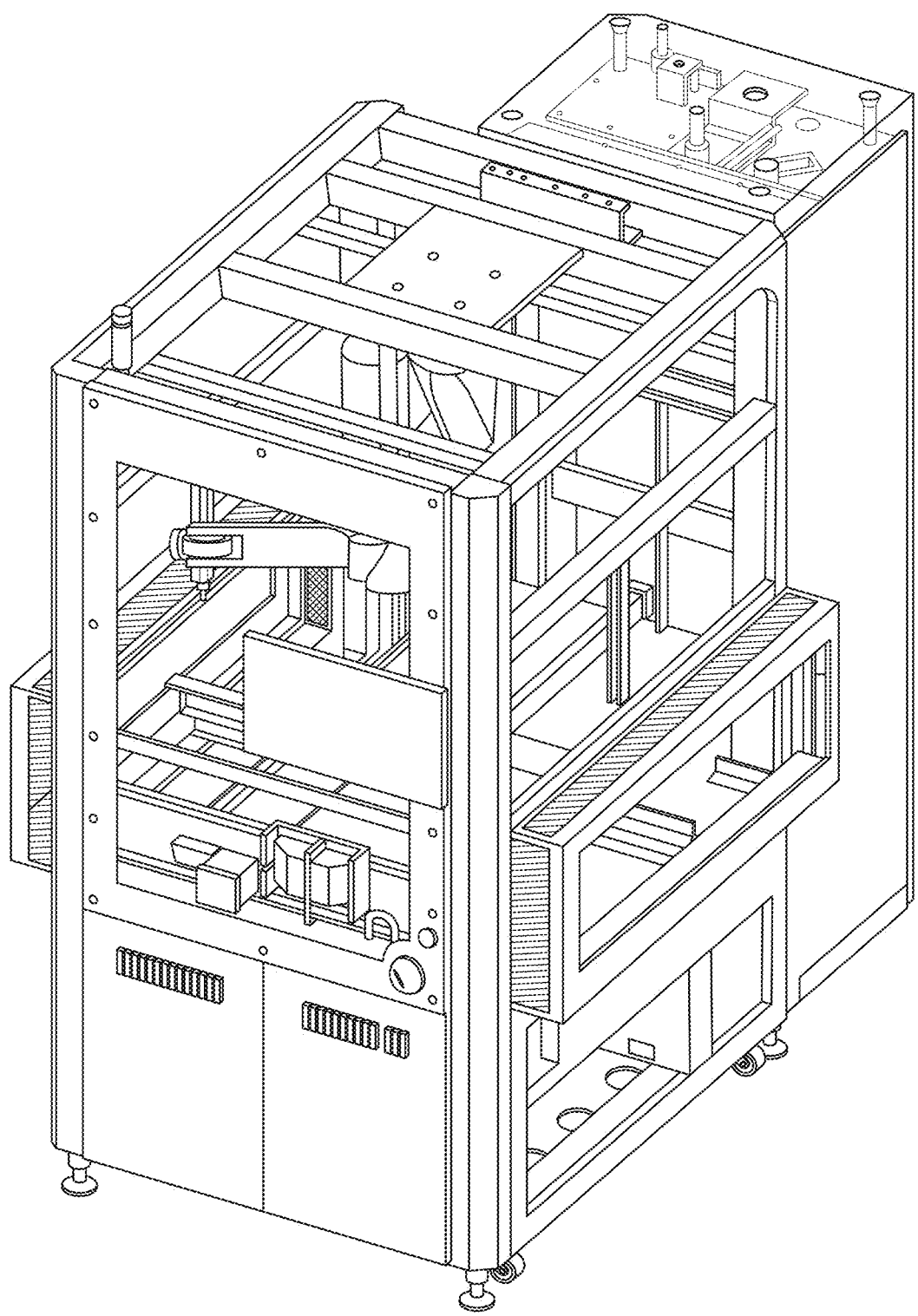
FIG. 10 is an overview diagram of one embodiment of a robotic cell, in which the object attachment handler end of arm tool may be utilized.

FIG. 10 is an overview diagram of one embodiment of a robotic cell, in which the object attachment handler end of arm tool may be utilized. The robotic cell includes a robot arm which may include the object application handler as an end-of-arm tool. In one embodiment, it can include a conveyor belt, through which boards onto which the objects are inserted may be moved. In one embodiment, it can include a tray feeder from which the objects may be picked up.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

We claim:

1. An object attachment handler comprising:
   a memory, the memory including a software definition of an object;
   a configurable gripper;
   a control system to configure the configurable gripper by defining an open and a closed position for jaws of the configurable gripper, to pick up and move the object, the configuration based on the software definition of the object;
   the configurable gripper for picking up the object and moving the object; and
   a fastening tool comprising a head and motors providing three degrees of movement, such that the fastening tool is aligned with an attachment mechanism of the object to be attached and lowered to an appropriate position to complete the attachment.

2. The object attachment handler of claim 1, wherein the position of each jaw of the configurable gripper is individually defined for the open and the closed positions.

3. The object attachment handler of claim 1, further comprising:
   the fastening tool comprising a hammer, for attaching an object by pushing down on an attachment mechanism.

4. The object attachment handler of claim 3, wherein the hammer is used for the attachment mechanisms comprising one or more of: press fit, push pin, rivet, snap on, and through hole.

5. The object attachment handler of claim 3, wherein the hammer is positioned aligned with the attachment mechanism, and the hammer is configured to lower with a set level of force, to a set distance, to complete the attachment of the attachment mechanism.

6. The object attachment handler of claim 1, wherein a user interface comprises a scanner to scan an object identifying code, and further comprising a database providing data about the object.

7. The object attachment handler of claim 1, wherein the configuration of the gripper comprises setting open dimensions and closed dimensions.

8. The object attachment handler of claim 1, further comprising:
   the fastening tool comprising a heat staking head with a melter, for use with a heat stake.

9. The object attachment handler of claim 1, further comprising:
   the fastening tool comprising a turning mechanism for use when the attachment mechanism comprises one or more components from a group consisting of:
   a bolt, screw, and spring screw-based attachment.

10. A software configured object attachment handler comprising:
    a memory to store an object configuration;
    a configurable gripper having jaws, the configurable gripper automatically configured by a control system to define an open and closed position for the jaws based on the object configuration from the memory;
    the configurable gripper to place an object on a workpiece for attachment; and
    a fastening tool automatically configured by the control system, the fastening tool set to attach the object to the workpiece, based on the object configuration, the fastening tool comprising a head and motors providing three degrees of movement, such that the fastening tool is aligned with an attachment mechanism of the object to be attached and lowered to an appropriate position to complete the attachment.

11. The object attachment handler of claim 10, wherein the fastening tool is a hammer, for attaching an object by pushing down on an attachment mechanism.

12. The object attachment handler of claim 11, wherein the hammer is used when the attachment mechanism comprises one or more components from a group consisting of: press fit, push pin, rivet, snap on, and through hole.

13. The object attachment handler of claim 11, wherein the hammer is positioned aligned with the attachment mechanism, and the hammer is configured to lower with a set level of force, to a set distance, to complete the attachment of the attachment mechanism.

14. The object attachment handler of claim 10, further comprising:
    an interface comprising one or more of:
    a user interface to enter data;
    a scanner to scan an object identifying code; and
    a database providing data about the object.

15. The object attachment handler of claim 10, wherein the fastening tool comprises a heat staking head when an attachment mechanism is a heat stake.

16. The object attachment handler of claim 10, wherein the fastening tool comprises a turning mechanism for use when the attachment mechanism comprises one or more components from a group consisting of: a bolt, screw, or spring screw-based attachment.

17. A method of utilizing a software-defined object attachment handler comprising:
receiving object configuration data from a control system, the object configuration data stored in a memory;
setting jaw open and jaw closed dimensions for a gripper, a starting position of one or more fastening tools, and an attachment process for the one or more fastening tools, based on the object configuration data in the memory;
receiving a new object configuration data from the control system; and
automatically reconfiguring the gripper based on the new object configuration data, without user interaction, and automatically reconfiguring the one or more fastening tools, wherein each fastening tool comprises a head and motors providing three degrees of movement, such that the one or more fastening tools are aligned with an attachment mechanism of the object, and moved to complete the attachment.

18. The method of claim 17, further comprising:
scanning an object identifying code on an object;
using the object identifying code to identify the object; and
retrieving the object configuration data based on the identified object.

19. The method of claim 17, wherein the one or more fastening tools comprises a hammer, for attaching an object by pushing down on an attachment mechanism, and the hammer is used for the attachment mechanism comprising one or more of: press fit, push pin, rivet, snap on, and through hole.

20. The method of claim 19, wherein the hammer is positioned aligned with the attachment mechanism, and the hammer is configured to lower with a set level of force, to a set distance, to complete the attachment of the attachment mechanism.

* * * * *